(12) United States Patent
Nishioka et al.

(10) Patent No.: US 8,351,157 B2
(45) Date of Patent: Jan. 8, 2013

(54) THIN FILM MAGNETIC HEAD HAVING TEMPERATURE DETECTION MECHANISM, HEAD GIMBALS ASSEMBLY, HEAD ARM ASSEMBLY AND MAGNETIC DISK DEVICE

(75) Inventors: Yasushi Nishioka, Tokyo (JP); Kazumi Nakatogawa, Tokyo (JP); Takayasu Kanaya, Tokyo (JP)

(73) Assignee: TDK Corporation, Tokyo (JP)

( * ) Notice: Subject to any disclaimer, the term of this patent is extended or adjusted under 35 U.S.C. 154(b) by 55 days.

(21) Appl. No.: 12/830,830

(22) Filed: Jul. 6, 2010

(65) Prior Publication Data

US 2012/0008230 A1    Jan. 12, 2012

(51) Int. Cl.
G11B 5/127        (2006.01)
(52) U.S. Cl. .................................. 360/125.31
(58) Field of Classification Search .............. 360/125.31
See application file for complete search history.

(56) References Cited

U.S. PATENT DOCUMENTS

| | | | |
|---|---|---|---|
| 5,991,113 A | 11/1999 | Meyer et al. | |
| 7,068,468 B2 | 6/2006 | Kamijima | |
| 7,589,928 B2 | 9/2009 | Roy et al. | |
| 7,986,481 B2 * | 7/2011 | Yamanaka et al. | 360/59 |
| 2003/0099054 A1 * | 5/2003 | Kamijima | 360/59 |
| 2003/0174430 A1 | 9/2003 | Takahashi et al. | |
| 2006/0034013 A1 * | 2/2006 | Kato et al. | 360/128 |
| 2007/0236836 A1 | 10/2007 | Kurita et al. | |
| 2008/0007871 A1 | 1/2008 | Kiyono et al. | |
| 2008/0043355 A1 | 2/2008 | Ota | |
| 2008/0094755 A1 | 4/2008 | Ota et al. | |

FOREIGN PATENT DOCUMENTS

| | | |
|---|---|---|
| JP | A-2003-168274 | 6/2003 |
| JP | A-2003-272335 | 9/2003 |
| JP | A-2004-164797 | 6/2004 |
| JP | A-2007-280502 | 10/2007 |
| JP | A-2008-165950 | 7/2008 |

OTHER PUBLICATIONS

U.S. Appl. No. 12/718,404, filed Mar. 5, 2010.

* cited by examiner

*Primary Examiner* — David D Davis
(74) *Attorney, Agent, or Firm* — Oliff & Berridge, PLC

(57) ABSTRACT

This thin film magnetic head has a magnetic read head and a magnetic write head each having respective end surfaces exposed to an ABS. The magnetic read head includes a magnetic reader including an end surface exposed to the ABS, first heat generator disposed on an opposite side of the magnetic reader from the ABS, and first temperature detector disposed closer to the ABS than the first heat generator is. The magnetic write head includes a magnetic pole having an end surface exposed to the ABS, second heat generator, and second temperature detector disposed closer to the ABS than the second heat generator is. The first heat generator and the first temperature detector adjust the protrusion of the magnetic read head, and the second heat generator and the second temperature detector adjust the protrusion of the magnetic write head.

14 Claims, 4 Drawing Sheets

THIN FILM MAGNETIC HEAD HAVING TEMPERATURE DETECTION MECHANISM, HEAD GIMBALS ASSEMBLY, HEAD ARM ASSEMBLY AND MAGNETIC DISK DEVICE

BACKGROUND OF THE INVENTION

1. Field of the Invention

The present invention relates to a thin film magnetic head incorporating both a magnetic read head section and a magnetic write head section, a head gimbals assembly, a head arm assembly, and a magnetic disk device.

2. Description of the Related Art

For recording and reading of magnetic information (hereinafter, simply referred to as information), a magnetic disk device has been used. The magnetic disk device is configured to include, in a chassis, a magnetic disk and a thin film magnetic head, for example. The magnetic disk is the one for storage of information, and the thin film magnetic head is for recording of information onto the magnetic disk, and for reproduction of the information recorded on the magnetic disk. The magnetic disk is supported by the rotation shaft of a spindle motor, and is so configured as to rotate about the shaft. The spindle motor is being fixed to the chassis. On the other hand, the thin film magnetic head is formed on one side surface of a magnetic head slider provided at one end of a suspension. Such a thin film magnetic head is configured to include a magnetic write element and a magnetic read element, each having an air bearing surface (ABS; Air Bearing Surface) opposing the magnetic disk. Specifically for the magnetic read element, an MR element having the magnetoresistive (MR: Magnetoresistive) effects has been popularly used. The other end of the suspension is attached to the tip end of an arm supported to a fixed shaft to be able to freely rotate. The fixed shaft is the one provided upright in the chassis.

In the thin film magnetic head, the ABSs are both being in contact with the surface of the magnetic disk with a slight pressure by the biasing force of the suspension when the magnetic disk device is not in operation, i.e., when the magnetic disk is not rotating and is not in motion. In such a state, when the magnetic disk device is put in motion, and when the magnetic disk is started to rotate, the magnetic head slider is responsively moved upward slightly, thereby forming a very small spacing (magnetic spacing) between the ABSs and the surface of the magnetic disk. Stabilizing the amount of such an upward movement of the magnetic disk may lead to the recording and reproduction of information with a good accuracy.

The concern here is that, in recent years, the magnetic disk has been increased in recording density (increased in capacity), and in accordance with such an increase, the recording track has been reduced in width. With a narrower recording track as such, the thin film magnetic head is also reduced in dimension, thereby reducing not only the capabilities of a magnetic write element in terms of signal recording onto the magnetic disk but also the intensity of a signal magnetic field from the magnetic disk. In order to compensate such capability reductions, there has been a need for reducing more the magnetic spacing (for bringing closer the ABSs of the thin film magnetic head to the surface of the magnetic disk).

For meeting such a need, an attempt has been made not to move upward that much the magnetic head slider in its entirety. However, this attempt has failed in not providing enough control, and as a result, the thin film magnetic head comes in contact with very small protrusions or others on the surface of the magnetic disk. This thus causes problems including generation of abnormal signals due to heat generation, and abrasion of the thin film magnetic head itself, for example.

In order to solve such problems, the applimayt of this patent application has proposed before a thin film magnetic head provided with heat generation means on the side opposite to the ABS of a magnetic conversion element being a combination of a magnetic write element and a magnetic read element (refer to Japanese Unexamined Patent Publication No. 2003-168274). With such a thin film magnetic head, during driving of the magnetic disk device, the magnetic conversion element is protruded to the side of the ABS utilizing the thermal expansion of the area in the vicinity of a heating element due to the heat generation thereof, thereby aiming to reduce the magnetic spacing. At this time, the amount of protrusion is adjusted with a high precision through control over the amount of heat generation so that the magnetic spacing reduced as such may be remained very small with a good stability. This accordingly leads to the great reduction of a probability of contact between the surface of the magnetic disk and the thin film magnetic head.

After the disclosure of such a thin film magnetic head, another type of thin film magnetic head is proposed in which a temperature detection section is provided, and based on information about the detected temperature, the amount of power supply for a heating element is controlled (an example includes Japanese Unexamined Patent Publication No. 2003-272335). In such a thin film magnetic head, a pair of heating elements are so provided as to sandwich therebetween a magnetic conversion element along the rotation direction of a magnetic disk, and the temperature detection section is provided between one of the heating elements and the magnetic conversion element. Moreover, as a related art, described is a magnetic disk device including a magnetic head slider provided with a heating element, and an arm provided with a temperature sensor (an example includes Specification of U.S. Pat. No. 5,991,113). Also in Japanese Unexamined Patent Publication No. 2008-165950, described is a magnetic head slider including two heaters in any same hierarchy in the vicinity of a thin film magnetic head. Still also in Japanese Unexamined Patent Publication No. 2007-280502, described is a magnetic head slider including a heater in the vicinity of a read element.

In spite thereof, because the magnetic disk has been recently increased in recording density (increased in capacity) all the more, the demand is increasingly growing for the magnetic spacing much smaller in size with much better stability to meet such an increase of recording density. With the thin film magnetic head in Japanese Unexamined Patent Publication No. 2003-168274, however, there is a problem of difficulty in controlling an extremely small magnetic spacing with a high precision through control over the power application to the heating element. This is because the temperature of the area in the vicinity of the heating element is easily affected by any heat generation due to driving of the magnetic conversion element in use, by the temperature environments in the vicinity area, and others. Similarly, with the thin film magnetic head in Japanese Unexamined Patent Publication No. 2003-272335, due to the configuration that the heating elements are so provided as to sandwich therebetween the magnetic conversion element along the rotation direction of the magnetic disk, the displacement in response to any change of power application may not be enough in the direction orthogonal to the ABS. As a result, the heat generation of the heating elements may possibly increase also the temperature of the magnetic conversion element. Also similarly, with the magnetic disk device in the Specification of U.S. Pat. No.

5,991,113, the distance is large between the heating element and the magnetic conversion element, and this thus may result in a large time lag until the amount of protrusion shows a change after the change of power application. Also similarly, with the magnetic head slider in Japanese Unexamined Patent Publication No. 2008-165950 and that in Japanese Unexamined Patent Publication No. 2007-280502, a certain degree of control may be indeed possible over the distance between the read element and the surface of the magnetic disk, but a sufficient degree of control may be difficult over the distance between a write element and the surface of the magnetic disk.

In consideration thereof, the ABS is expected to be controlled by the amount of protrusion thereof with a higher precision to ensure that the magnetic spacing is to be very small with a high precision.

SUMMARY OF THE INVENTION

A thin film magnetic head in an embodiment of the invention includes, on a substrate, a magnetic read head section and a magnetic write head section each having an end surface exposed to an air bearing surface. The magnetic read head section includes a magnetic read element, first heat generation means, and first temperature detection means. The magnetic read head section has an end surface exposed to the air bearing surface, and the first heat generation means is disposed on the side opposite to the air bearing surface with the magnetic read element sandwiched therebetween. The first temperature detection means is disposed closer to the air bearing surface than the first heat generation means is. The magnetic write head section includes a magnetic pole, second heat generation means, and second temperature detection means. The magnetic pole has an end surface exposed to the air bearing surface, and the second temperature detection means is disposed closer to the air bearing surface than the second heat generation means is.

A head gimbals assembly, a head arm assembly, and a magnetic disk device in another embodiment of the invention are each provided with the thin film magnetic head described above.

In the thin film magnetic head, the head gimbals assembly, the head arm assembly, and the magnetic disk device in the embodiments of the invention, the magnetic read head section and the magnetic write head section are each provided with a pair of heat generation means and temperature detection means. Such a configuration allows the magnetic read head section and the magnetic write head section to separately adjust the power application to the heat generation means in accordance with the temperature detected by their own temperature detection means. This accordingly enables to optimize the protrusion amount separately in the magnetic read head section and the magnetic write head section, thereby being able to control the magnetic spacing to be very small with a high precision between the ABS of the thin film magnetic head and the surface of the magnetic disk. This is considered very advantageous in terms of keeping up with the high density recording.

DETAILED DESCRIPTION OF THE PREFERRED EMBODIMENT

In the below, an embodiment of the invention is described in detail by referring to the accompanying drawings.

[Configuration of Magnetic Disk Device]

First of all, by referring to FIGS. 1 and 2, the configuration of a magnetic disk device of the embodiment of the invention is described below.

Figure 1:
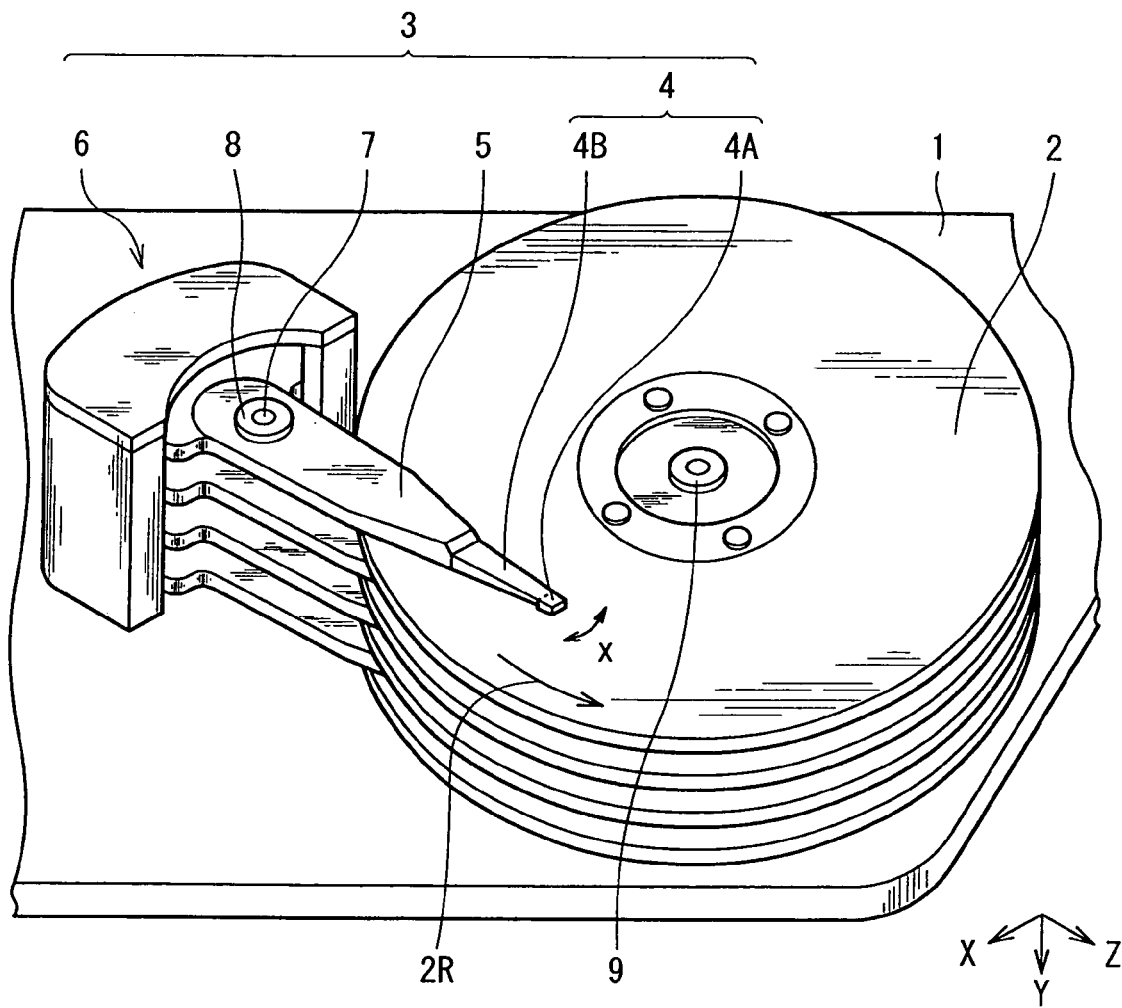
FIG. 1 is a perspective view of a magnetic disk device including a thin film magnetic head as an embodiment of the invention, showing the configuration thereof.

FIG. 1 is a perspective view of the magnetic disk device of the embodiment, showing the internal configuration thereof. This magnetic disk device operates in a CSS (Contact-Start-Stop) mode as a driving mode, and is configured to include a magnetic disk 2 and a head arm assembly (HAA; Head Arm Assembly) 3 inside of a chassis 1, for example. The magnetic disk 2 serves as a magnetic recording medium for recording of information, and the HAA 3 is provided for recording of information onto the magnetic disk 2, and for reproduction of the information. The HAA 3 is configured to include a head gimbals assembly (HGA; Head Gimbals Assembly) 4, an arm 5 for supporting the base portion of this HGA 4, and a drive section 6 serving as a power source for rotating this arm 5. The HGA 4 is configured to include a magnetic head slider (hereinafter, simply referred to as "slider") 4A, and a suspension 4B. The slider 4A is provided, on one side surface, with a thin film magnetic head 10 (will be described later) of this embodiment, and the suspension 4B is attached with this slider 4A at one end. The other end of the suspension 4B (end portion on the side opposite to the slider 4A) is being supported by the arm 5. The arm 5 is so configured as to be able to rotate about a fixed shaft 7 fixed as a center axis to the chassis 1 via a bearing 8. The drive section 6 is exemplified by a voice coil motor or others. Note here that the magnetic disk device is provided with a plurality of magnetic disks 2 (four pieces in FIG. 1), and the slider 4A is provided to the recording surfaces (both surface and underside) 2S of each of the magnetic disks 2. These sliders 4A are allowed to move in the direction across the recording tracks (X-axis direction) in the plane parallel to their respective recording surfaces 2S of the magnetic disks 2. On the other hand, the magnetic disks 2 are each so configured as to rotate in a rotation direction 2R about a spindle motor 9 fixed to the chassis 1. The rotation direction 2R is the one almost orthogonal to the X-axis direction. In response to when any of the magnetic disks 2 is rotated and when the slider 4A corresponding thereto is moved, the magnetic disk 2 is recorded with information, or any information recorded thereon is read therefrom.

Figure 2:
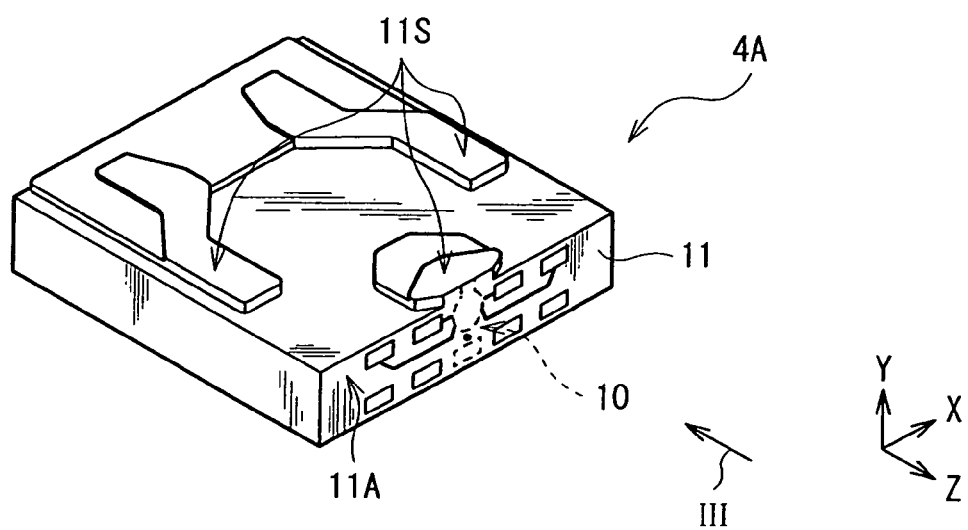
FIG. 2 is a perspective view of a slider in the magnetic disk device of FIG. 1, showing the configuration thereof.

FIG. 2 shows the configuration of the slider 4A of FIG. 1. This slider 4A is configured to include a substrate 11 that is in the block shape and is made of AlTiC ($Al_2O_3 \cdot TiC$), for example. Such a substrate 11 is formed in the shape of almost a hexahedron, for example, and one face thereof serves as an ABS 11S disposed to oppose the recording surfaces 2S of the corresponding magnetic disk 2 in a close range. When the magnetic disk device is not in operation, that is, when the spindle motor 9 is not in motion and when the magnetic disk 2 is not rotating, the ABS 11S and the recording surfaces 2S are being in contact with each other. When the magnetic disk 2 starts rotating at a high speed by the operation of the spindle motor 9, an airflow is responsively generated between the recording surfaces 2S and the ABS 11S. The lift caused by such an airflow moves up the slider 4A in the direction orthogonal to the recording surfaces 2S, i.e., Y-axis direction, so that a fixed spacing (Magnetic Spacing) MS (refer to FIG. 5 that will be described later) is formed between the ABS 11S and the magnetic disk 2. An element forming surface 11A being one side surface orthogonal to the ABS 11S is provided with a thin film magnetic head 10.

[Detailed Configuration of Thin Film Magnetic Head]

By referring to FIGS. 3 and 4, described in detail next is the thin film magnetic head 10.

Figure 3:
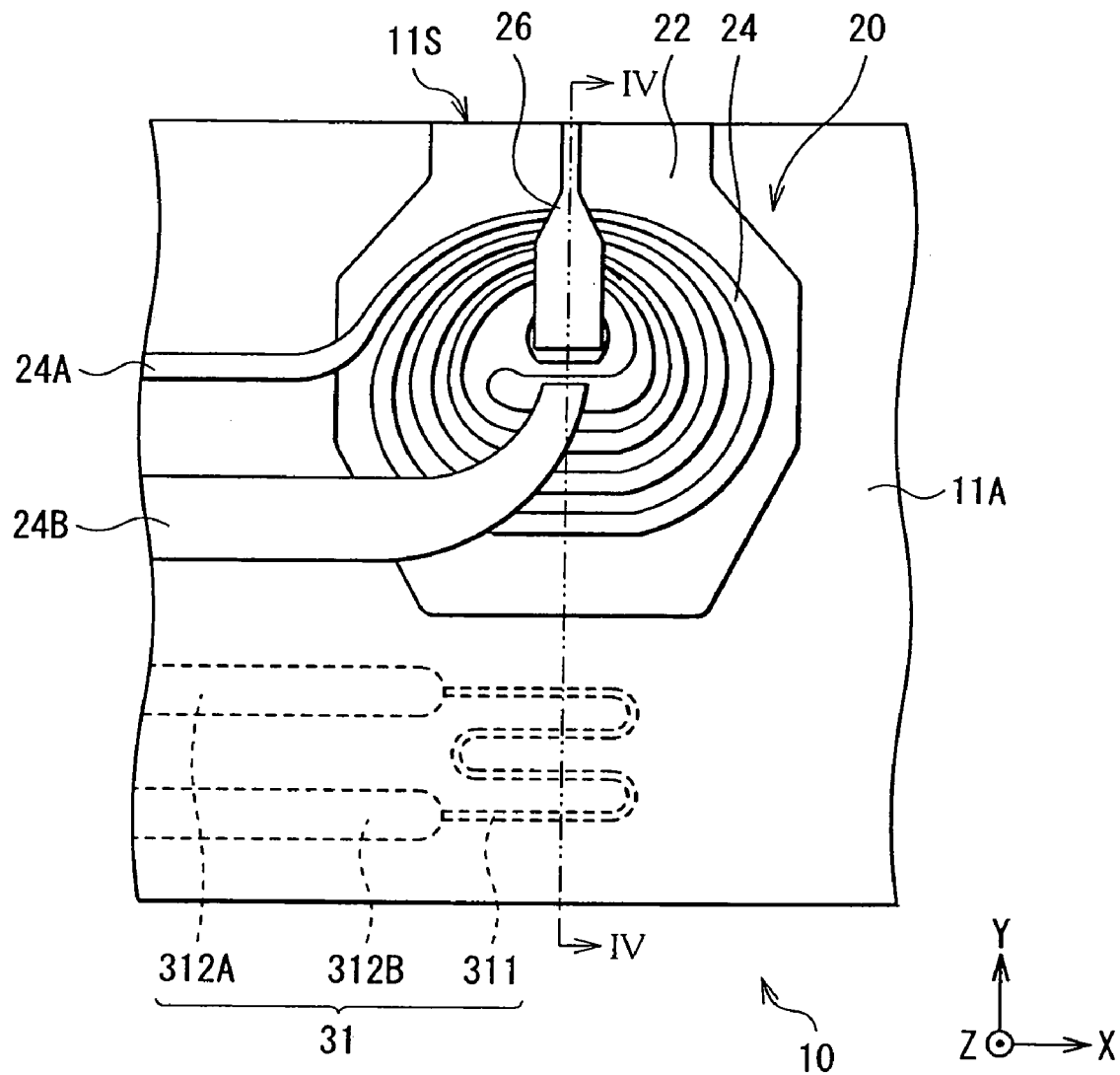
FIG. 3 is a plan view of the main part of the thin film magnetic head of FIG. 2, showing the configuration thereof when it is viewed from the direction of an arrow of III.
Figure 4:
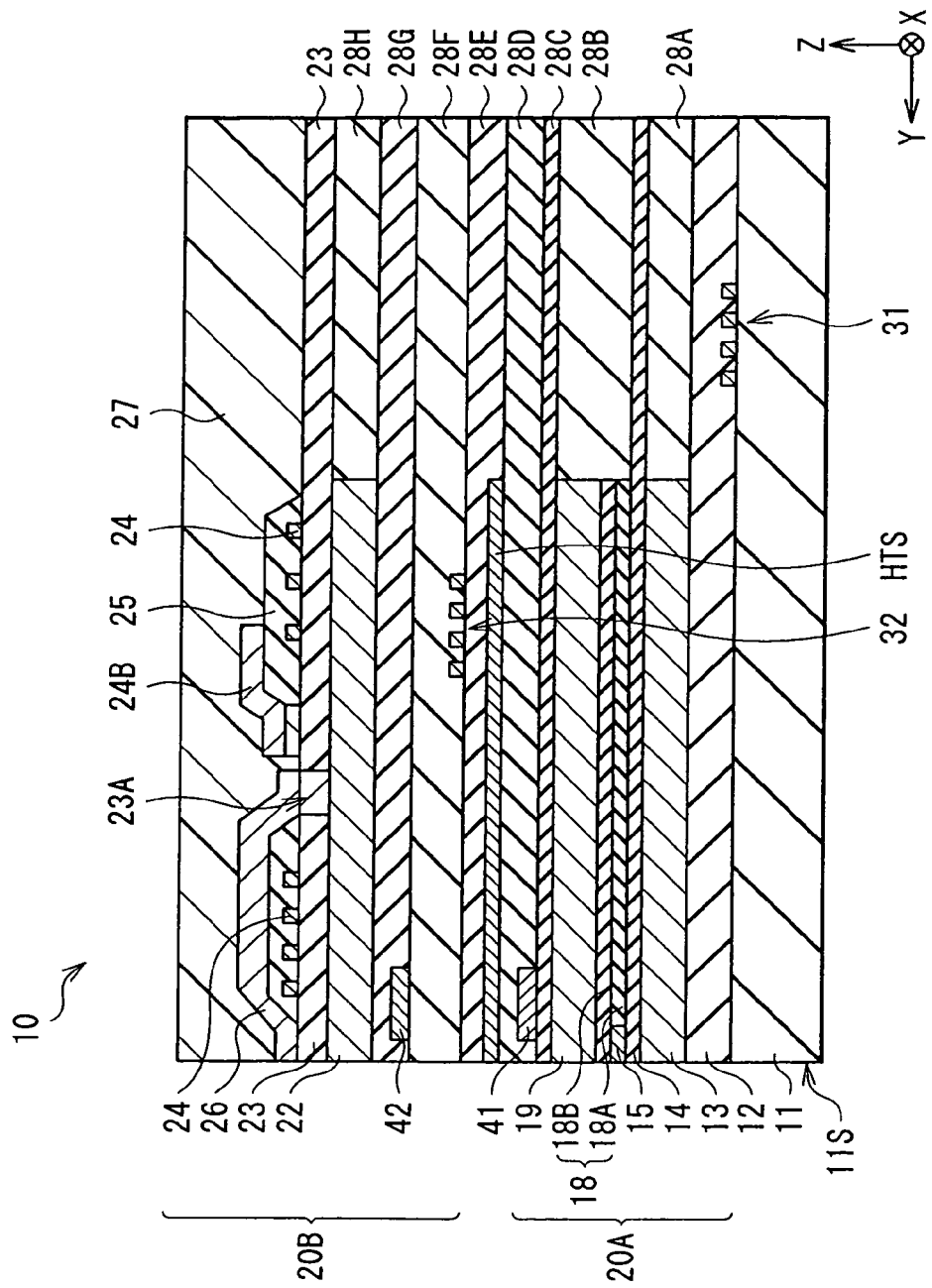
FIG. 4 is a cross-sectional view of the thin film magnetic head of FIG. 3, showing the configuration thereof when it is viewed along the direction of an arrow along a line IV-IV.

FIG. 3 is a plan view of the thin film magnetic head 10 viewed from the direction of an arrow III of FIG. 2, and FIG. 4 is a cross-sectional view thereof showing the configuration viewed from the direction of an arrow along a line IV-IV of FIG. 3. The thin film magnetic head 10 is in the lamination structure including a read head section 20A, a heat shield layer HTS, and a write head section 20B, which are laid one on the other on the substrate 11 in this order. The read head section 20A and the write head section 20B each have an end surface exposed to the ABS 11S.

The read head section 20A is provided with a magnetoresistive (MR) element 15, a heater 31, and a resistance sensor 41. The MR element 15 also has an end surface exposed to the ABS 11S. The heater 31 is located on the side opposite to the ABS 11S with the MR element 15 sandwiched therebetween, and the resistance sensor 41 is located closer to the ABS 11S than the heater 31 is. The MR element 15 is the one serving as a sensor for reading of magnetic information recorded on the magnetic disk 2.

On the other hand, the write head section 20B is configured to include a lower magnetic pole 22 and an upper magnetic pole 26 each having an end surface exposed to the ABS 11S, a heater 32, and a resistance sensor 42. The resistance sensor 42 is located closer in the Y-axis direction to the ABS 11S than the heater 32 is. Note here that the heater 32 and the resistance sensor 42 are disposed in different hierarchies. That is, the heater 32 is located below the resistance sensor 42 so that the positional relationship causes no component overlapping in the lamination plane (in the XY plane). The write head section 20B is for recording of magnetic information onto the recording tracks of the magnetic disk 2.

Note that, in this embodiment, in the direction orthogonal to the ABS 11S (Y-axis direction), the side of the ABS 11S viewed from the MR element 15 is referred to as "front", and the side opposite to the ABS 11S is referred to as "rear".

The read head section 20A is in the configuration of CIP (Current In Plane)—GMR (Giant Magnetoresistive) in which a sense current is directed in the direction of the lamination plane inside of the MR element 15. To be specific, as shown in FIG. 4, the read head section 20A includes, on the side exposed to the ABS 11S, an insulation layer 12 (FIG. 4), a lower shield layer 13, a lower gap layer 14, the MR element 15, an upper gap layer 18, an upper shield layer 19, and insulation layers 28Mayd 28D, which are laid in this order on the substrate 11, for example. In this example, the insulation layer 12 is embedded therein with the heater 31, and the insulation layer 28D is embedded therein with the resistance sensor 41. Provided between the lower gap layer 14 and the upper gap layer 18 are a pair of magnetic-domain control layers (not shown), and a pair of conductive lead layers (not shown). The pair of magnetic-domain control layers are respectively extended and adjacent to both sides of the MR element 15, and the conductive lead layers are respectively formed on the magnetic-domain control layers. The upper gap layer 18 is so provided as to enclose also the rear portion of the MR element 15. More in detail, the upper gap layer 18 is configured by two portions of a first portion 18A and a second portion 18B. The first portion 18A occupies the rear portion of the MR element 15, and the second portion 18B covers the upper surface of the MR element 15 (and the conductive lead layers). To the rear portion of the lower shield layer 13 and that of the upper shield layer 18, insulation layers 28A and 28B are respectively filled.

The lower shield layer 13 and the upper shield layer 19 are each made of a soft magnetic metal material such as nickel-iron alloy (NiFe), and are so disposed as to oppose each other with the MR element 15 sandwiched therebetween in the lamination direction (Z-axis direction), for example. Such a configuration helps to protect the MR element 15 from any influence of unwanted magnetic field. The lower gap layer 14 is made of an insulation material exemplified by aluminum oxide ($Al_2O_3$), aluminum nitride (AlN), silicon dioxide ($SiO_2$), or diamond-like carbon (DLC), and mainly serves to provide electrical isolation between the lower shield layer 13 and the MR element 15. The upper gap layer 18 is made of an insulation material similar to that of the lower gap layer 14, and serves to provide electrical insulation between the upper shield layer 19 and the MR element 15. The MR element 15 functions as a sensor portion in charge of detecting any change of the signal magnetic field based on the information recorded on the magnetic disk 2. Such an MR element 15 is a laminate in the spin-valve configuration including, in order from the side of the lower gap layer 14, a pinning layer, a pinned layer, a non-magnetic layer, a free layer, and a protection layer (none of which is shown), for example. A pair of magnetic-domain control layers specifically each serve to align the magnetic domains in the free layer through application of a predetermined longitudinal-bias magnetic field to the free layer, thereby forming a single-domain layer. Such magnetic-domain control layers are each made of a hard magnetic material such as cobalt-platinum alloy (CoPt). A pair of conductive lead layers each function as a current path for a supply of sense current to the MR element 15 in the in-plane direction of the laminate (X-axis direction). These conductive lead layers are respectively connected to a pair of electrodes formed on an element forming surface 11A.

In the read head section 20A configured as such, the free layer in the MR element 15 is changed in magnetization direction in accordance with the signal magnetic field from the magnetic disk 2. Such a change of the magnetization direction of the free layer accordingly causes a change relative to the magnetization direction of the pinned layer also in the MR element 15. Such a relative change in the magnetization direction appears as a change of electrical resistance in response to a supply of sense current to the MR element 15 via a pair of conductive lead layers. Therefore, by utilizing this phenomenon, the signal magnetic field is detected to read the magnetic information.

On the other hand, the write head section 20B is provided on the read head section 20A via a heat shield layer HTS, which is embedded in an insulation layer 28E. The write head section 20B includes, in order from the side of the heat shield layer HTS, an insulation layer 28F, an insulation layer 28G, a lower magnetic pole 22, a recording gap layer 23, a coil 24, and an upper magnetic pole 26. The insulation layer 28F is embedded therein with the heater 32, and the insulation layer 28G is embedded therein with a resistance sensor 42. The coil 24 is covered by an insulation layer 25.

The lower magnetic pole 22 is made of a magnetic material such as NiFe, and is formed on the insulation layer 28G. In this configuration, the rear portion of the lower magnetic pole 22 is filled with an insulation layer 28H. The lower magnetic pole 22 is provided thereon with the recording gap layer 23 made of an insulation material such as $Al_2O_3$. This recording gap layer 23 is formed with, at a position corresponding to the center portion of the coil 24 on the XY plane, an aperture portion 23A for formation of a magnetic path. The coil 24 is made of copper (Cu), gold (Au), or others, and is disposed on the recording gap layer 23 in such a manner as to wind around the aperture portion 23A. Such a coil 24 is covered mostly (excepting the end portions thereof) by the insulation layer 25 made of a photoresist or others. The coil 24 is connected, at both ends, to a pair of electrodes formed on the element forming surface 11A respectively via coil leads 24A and 24B. Moreover, the upper magnetic pole 26 is so formed as to cover all of the recording gap layer 23, the aperture portion 23A, and the insulation layer 25. Such an upper magnetic pole 26 is made of a soft magnetic material with a high saturation magnetic flux density such as nickel-iron alloy (NiFe), for example, and is being in contact with the lower magnetic pole 22 via the aperture portion 23A so that a magnetic coupling is established therebetween. A protection layer 27 made of $Al_2O_3$ or others is so formed as to cover entirely the upper surface of the write head section 20B.

In the write head section 20B configured as such, a write current flowing to the coil 24 generates a magnetic flux in the magnetic path, which is configured mainly by the lower magnetic pole 22 and the upper magnetic pole 26. This accordingly generates a signal magnetic field in the vicinity of the recording gap layer 23, and by the resulting signal magnetic field, any predetermined area portion is magnetized on the recording surfaces 2S (will be described later) of the corresponding magnetic disk 2 so that any information is accordingly recorded thereby.

The heaters 31 and 32 are similar to those described in US patent publication No. 2008-0043355, US patent publication No. 2008-94755, US patent publication No. 2008-007871, and others, and each generate itself heat for thermally expanding the area therearound so that the ABS 11S of the thin film magnetic head 10 is protruded to reduce the distance from the surface of the magnetic disk 2.

The heater 31 is configured to include a heating element 311 (FIG. 3), and a pair of leads 312A and 312B (FIG. 3). The heating element 311 is the one formed on the substrate 11 via the insulation layer 12, and the leads 312A and 312B are those respectively connected to both ends of the heating element 311. The heating element 311 is a line pattern winding on the insulation layer 12, for example, and is made of a material at least including any one of nickel-chromium alloy (NiCr), copper (Cu), gold (Au), nickel (Ni), cobalt (Co), tantalum (Ta), tungsten (W), molybdenum (Mo), and rhodium (Rh). The leads 312A and 312B are connected to electrodes (not shown) provided on the element forming surface 11A. Note here that the heater 31 is preferably disposed behind the lower shield layer 13 and the upper shield layer 19 not to overlap therewith in the lamination direction (Z-axis direction). This is to avoid causing a height difference to the lower shield layer 13 and the upper shield layer 19 and thus impairing the flatness thereof due to the heater 31 formed before these layers in the assembly process of the thin film magnetic head 10. If the lower shield layer 13 and the upper shield layer 19 fail to be flat as such, this may induce generation of any noise that would adversely affect the MR element 15. With these reasons, any factor that may cause a height difference between the lower shield layer 13 and the upper shield layer 19 is preferably eliminated as much as possible.

The heater 32 is provided on the insulation layer 28D covering the heat shield layer HTS, and similarly to the heater 31, includes a heating element (not shown), and a pair of leads (not shown) respectively connected to both ends of the heating element, for example. The heater 32 may be provided to be closer to the ABS 11S than the heater 31 is in an area where the heater 32 overlaps with the lower shield layer 13 and the upper shield layer 19 in the read head section 20A in the lamination direction (Z-axis direction), for example. This is because the heater 32 does not get in the way of the lower shield layer 13 and the upper shield layer 19 in the assembly process. In such a configuration, the heaters 31 and 32 are preferably so disposed as to cover the center position of the thin film magnetic head 10 in the width direction of the recording tracks (X-axis direction). Note that the heater 32 is not shown in FIG. 3.

The resistance sensors 41 and 42 each function similarly to the element sensor utilizing thermal asperity described in US patent publication No. 2008-007871, and each detect any heat generation as a result of the thin film magnetic head 10 coming in contact with the magnetic disk 2 based on any change (increase) of its own electrical resistance value. Such resistance sensors 41 and 42 may each include an end surface exposed to the ABS 11S, and are made of, for example, NiFe with the thickness of 30 nm, and is disposed at a position behind the ABS 11S away therefrom by the distance of about 10 nm to 200 nm, for example. The material of the resistance sensors 41 and 42 is not restricted to NiFe as above, and may also include nickel (Ni), titanium (Ti), tungsten (W), platinum (Pt), tantalum (Ta), ruthenium (Ru), gold (Au) or alloy including one or more of these elements. Further, the resistance sensors 41 and 42 are not restricted to be in the single-layer configuration, and may be in the multi-layer configuration in which the layers are made of same type of material or different types of materials. Still further, the resistance sensors 41 and 42 may be so disposed that their end surfaces are both exposed to the ABS 11S. If this is the configuration, as shown in FIG. 4, the temperature detection may be made with a higher sensitivity compared with the configuration in which such end surfaces are disposed behind the ABS 11S. In terms of preventing any deterioration and damage resulted from the contact with the surface of the magnetic disk 2, however, the resistance sensors 41 and 42 are preferably disposed at the positions behind the ABS 11S as shown in FIG. 4.

The heat shield layer HTS is for preventing the movement of heat between the read head section 20A and the write head section 20B, and especially for protecting the resistance sensor 41 from any influence of the heat generated by the heater 32. Such a heat shield layer HTS is made of any one of nickel (Ni), iron (Fe), tantalum (Ta), titanium (Ti), cobalt (Co), copper (Cu), and gold (Au), or an alloy of one or more of these elements. The resulting heat shield layer HTS functions to release the heat in the thin film magnetic head 10 to the outside from the end surface exposed to the ABS 11S.

[Manufacturing Method of Thin film Magnetic Head]

By mainly referring to FIG. 4, described next is the manufacturing method of the thin film magnetic head 10.

First of all, the heater 31 is formed at a predetermined position behind both the lower shield layer 13 and the upper shield layer 19 that will be formed later. In this example, a thin film is formed on the substrate 11 using the material described above by sputtering, vapor deposition, chemical vapor deposition (CVD), or plating, for example. Thereafter, utilizing the resist pattern in a predetermined shape formed on the resulting thin film, reactive ion etching (RIE) or milling is performed to peel off the resist pattern.

Next, by sputtering or others, the substrate 11 is formed entirely thereon with the insulation layer 12 in such a manner as to embed therein the heater 31. In this example, the insulation layer 12 is preferably formed using $Al_2O_3$ or $SiO_2$ with the thickness of 0.1 µm to 5.0 µm, for example.

Next, the lower shield layer 13 is selectively formed by frame plating or others at a predetermined position in front of the heater 31. In this example, the lower shield layer 13 is formed with the thickness of 0.5 µm to 3 µm, for example. The material for such a lower shield layer 13 includes not only NiFe but also cobalt-iron-nickel alloy (CoFeNi), cobalt-iron alloy (CoFe), iron nitride (FeN), or iron zirconium nitride (FeZrN), for example. Thereafter, another insulation film is formed using $Al_2O_3$ or $SiO_2$ by sputtering or others in such a manner as to embed therein the lower shield layer 13. The resulting insulation film is then planarized by CMP (Chemical Mechanical Polishing) or others until the lower shield layer 13 is exposed therefrom, thereby forming the insulation layer 28A. After the planarization as such, by CVD or sputtering, the lower gap layer 14 is formed all over the insulation layer 28A with the thickness of 10 nm to 50 nm, for example.

Next, at the foremost position on the lower gap layer 14, the MR element 15 is formed, and to be adjacent to the MR element 15, the magnetic-domain control layers and the conductive lead layers are formed. In this example, first of all, a multi-layer film is formed all over the lower gap layer 14, and then a mask pattern (not shown) is formed to cover not entirely but selectively the multi-layer film. The multi-layer film is a laminate including a pinning layer, a pinned layer, a non-magnetic layer, a free layer, and a protection layer in this order. The mask pattern is formed with an aperture portion corresponding to the shape of the magnetic-domain control layers and that of the conductive lead layers. The multi-layer film is then etched by milling utilizing such a mask pattern, and to the area with the multi-layer film removed, the magnetic-domain control layers and the conductive lead layers are laminated in order by sputtering. The mask pattern is dissolved and removed by an organic solvent such as acetone or N-methylpyrrolidone (NMP), and then another mask pattern (not shown) is newly formed in the combined shape of the MR element 15 and the conductive lead layers. By using the resulting mask pattern as a mask for milling, any unnecessary portion of the multi-layer film is removed. Such a process form the MR element 15, the magnetic-domain control layers, and the conductive lead layers. For the purpose of easing the dissolving and removing of the mask pattern, the mask pattern preferably has the cross section in the shape of reverse trapezoid (the shape in which the width is increased by degrees from the bottom surface toward the upper surface).

The upper gap layer 18 is then so formed as to cover all of the MR element 15, the magnetic-domain control layers, and the conductive lead layers. In this example, the upper gap layer 18 is formed with the thickness of 10 nm to 50 nm, for example, by sputtering, CVD, or others. The upper gap layer 18 formed as such is then provided thereon with the upper shield layer 19 with the thickness of about 0.5 µm to 3.0 µm by frame plating, for example. The upper gap layer 18 and the upper shield layer 19 are formed in their corresponding areas opposing the lower shield layer 13. On the lower gap layer 14, the area behind the upper gap layer 18 and the area behind the upper shield layer 19, i.e., the area above the heater 31, is formed with the insulation layer 28B by sputtering or others as shown in FIG. 4. The resulting insulation layer 28B is then subjected to the planarization process by CMP.

The insulation layer 28C is then formed to entirely cover the resulting laminate, and the resistance sensor 41 is then formed at a predetermined position on the insulation layer 28C. In such a manner as to embed the resistance sensor 41, the insulation layer 28D is formed entirely thereon. These insulation layers 28Mayd 28D are each formed by sputtering or others using $Al_2O_3$ or $SiO_2$, for example. After this, the assembly process of the read head section 20A is temporarily terminated.

After the assembly process of the read head section 20A as such, using the material described above, the heat shield layer HTS is formed to the areas corresponding to the lower shield layer 13 and the upper shield layer 19. For forming the heat shield layer HTS, a metal film is so formed as to entirely cover the insulation layer 28D, for example, by sputtering or vapor evaporation using any one of nickel (Ni), iron (Fe), tantalum (Ta), titanium (Ti), cobalt (Co), copper (Cu), and gold (Au), or an alloy of one or more of these elements. The resulting metal film is then etched into a predetermined shape. The heat shield layer HTS formed as such is provided entirely thereon with the insulation layer 28E in such a manner as to embed thereby the heat shield layer HTS.

Thereafter, on the insulation layer 28E, at a predetermined position in the area overlapping the heat shield layer HTS, the heater 32 is formed with a technique similar to that for the heater 31. The heater 32 is then entirely covered by the insulation layer 28F in such a manner as to embed thereby the heater 32 by sputtering or others, and the resistance sensor 42 is formed at a predetermined position closer to the ABS 11S than the heater 32 is. The insulation layer 28G is then formed entirely over the resistance sensor 42 in such a manner as to embed thereby the resistance sensor 42. Herein, the insulation layers 28E to 28G are each formed by sputtering or CVD using $Al_2O_3$ or $SiO_2$, for example.

Thereafter, the lower magnetic pole 22 is formed on the insulation layer 28G with the thickness of about 0.5 µm to 0.3 µm by frame plating, for example. In this example, the material therefore includes not only NiFe but also CoFeNi, CoFe, FeN, FeZrN, and others. The insulation layer 28H is then formed to the area behind the lower magnetic pole 22, and the resulting insulation layer 28H is then subjected to the planarization process by CMP. The recording gap layer 23 is then formed with an aperture portion 23A in such a manner as to selectively cover the lower magnetic pole 22 and the insulation layer 28H. In this example, the recording gap layer 23 is formed with the thickness of 10 nm to 50 nm by sputtering or CVD, for example.

After the recording gap layer 23 is formed as such, the coil 24 is formed with the thickness of about 1 µm to 5 µm by frame plating, for example. The insulation layer 25 is then so formed as to cover a part of the coil 24. The upper magnetic pole 26 is then formed to cover the insulation layer 25 and to couple with the lower magnetic pole 22. The coil lead 24B is also formed for a coupling with a part of the coil 24 not covered by the insulation layer 25 and thus exposed. In this example, as to the insulation layer 25, the photoresist only on any predetermined portion thereof is exposed to light, and then is subjected to a heating process (curing) if required. The upper magnetic pole 26 and the coil lead 24B may be formed by frame plating.

Lastly, in such a manner as to entirely cover the laminate including the upper magnetic pole 26, the protection film 27 is formed by sputtering or others, and the resulting protection film 27 is planarized by CMP or others. As a result, the write head section 20B is accordingly formed. Any predetermined process such as forming the ABS 11S by mechanical polishing of the slider 4A is then executed so that the thin film magnetic head 10 is completed including the read head section 20A, the heat shield layer HTS, and the write head section 20B.

[Operation, Advantages, and Effects of Magnetic Disk Device]

Figure 5:
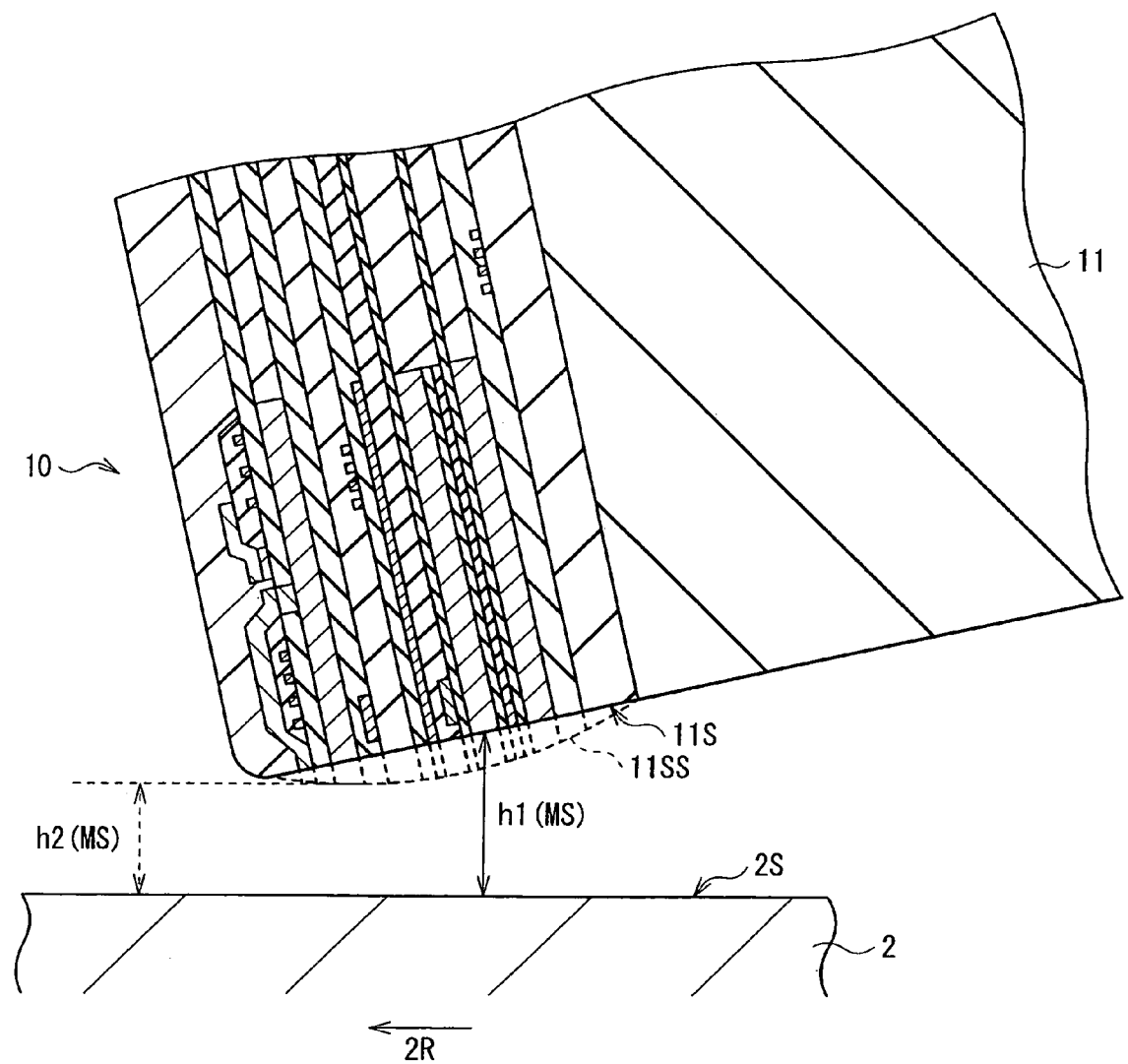
FIG. 5 is a diagram illustrating the driving state of a magnetic disk and that of a thin film magnetic head in the magnetic disk device of FIG. 1.

By referring also to FIG. 5 in addition to FIGS. 1 to 4, the magnetic disk device provided with the thin film magnetic head 10 configured as above is described about the operation and advantages thereof. FIG. 5 is a cross-sectional view of the magnetic disk 2 and that of the thin film magnetic head 10, showing their positional relationship during writing or reading.

With such a magnetic disk device, for writing (recording) and reading (reproducing) of any magnetic information, the magnetic disk 2 is rotated at a high speed in the direction of an arrow 2R (FIGS. 1 and 5) by the spindle motor 9 so that the slider 4A is moved upward from the recording surfaces 2S (FIG. 5). At this time, the thin film magnetic head 10 is tilted forward on the side of the write head section 20B to be closer to the recording surfaces 2S than the side of the read head section 20A is. Immediately after the rotation of the magnetic disk 2 is stabilized, the magnetic spacing MS becomes h1.

In this example, when the heating element is made to generate heat by the power supply to each of the heaters 31 and 32, the area in a close range of the heating element, especially the insulation layers 12, and 28E to 28G are thermally expanded. This accordingly pushes forward the read head section 20A and the write head section 20B, and the ABS 11S is thus protruded to the position of an ABS 11SS indicated by a chain double-dashed line. This accordingly reduces to h2 the spacing of the recording surfaces 2S from the read head section 20A and the write head section 20B, i.e., the magnetic spacing MS. Such a reduction of the magnetic spacing MS favorably leads to the higher reproduction output, and a possibility of writing onto the recording tracks narrower in width. In this case, adjusting the amount of power supply to the heaters 31 and 32 enables to control the amount of protrusion.

As such, in this embodiment, the ABS 11S in the thin film magnetic head 10 is controlled with a good accuracy in terms of amount of protrusion by the appropriate layout of the heaters 31 and 32, and the resistance sensors 41 and 42, so that the magnetic spacing MS may remain very small with a good stability during driving, and thus the probability of contact with the recording surfaces 2S may be reduced to a further degree. This accordingly enables the resulting magnetic disk device to meet a much higher recording density.

In this embodiment, especially, the read head section 20A is provided with the heater 31 and the resistance sensor 41 as a pair, and the write head section 20B is provided with the heater 32 and the resistance sensor 42 as a pair. This configuration thus allows the read head section 20A and the write head section 20B to separately adjust therein the power application to the heaters 31 and 32 based on the temperature detected by the resistance sensors 41 and 42. As a result, the read head section 20A and the write head section 20B may be separately controlled therein to be optimal in terms of protrusion, thereby being able to keep very small the magnetic spacing MS with a good accuracy. This is considered highly advantageous to meet a higher recording density.

Moreover, in this embodiment, the heat shield layer HTS is provided between the read head section 20A and the write head section 20B. This configuration favorably prevents the heat energy generated by the heater 31 from reaching the write head section 20B, and the heat energy generated by the heater 32 from reaching the read head section 20A. As a result, the end surface exposed to the ABS 11S in the read head section 20A may be controlled separately from the end surface exposed to the ABS 11S in the write head section 20B both with a higher accuracy.

Also in the configuration, the resistance sensors 41 and 42 are both provided to partially expose to the ABS 11S or to be very close to the ABS 11S, thereby being able to detect with a high sensitivity whether or not the ABS 11S is being in contact with the recording surfaces 2S of the magnetic disk 2. This is considered also very advantageous to control the magnetic spacing MS with a higher accuracy.

Further, the heater 31 is disposed in an area not overlapping the lower shield layer 13 and the upper shield layer 19 in the lamination direction (Z-axis direction), i.e., in an area behind the lower shield layer 13 and the upper shield layer 19. This favorably provides satisfactory flatness to both the lower shield layer 13 and the upper shield layer 19. Such satisfactory flatness accordingly prevents generation of any noise adversely affecting the MR element 15 during the reproduction operation of the thin film magnetic head 10, thereby being able to ensure the superior reproduction capabilities.

While the invention has been described by exemplifying the embodiment, the foregoing description is in all aspects illustrative and not restrictive. It is understood that numerous other modifications and variations may be devised. For example, in the embodiment, exemplified is the read element being a CIP-type GMR element, but this is surely not restrictive. Alternatively, the read element may be of a CPP (Current Perpendicular to the Plane)-type, or may be a TMR (tunneling magnetoresistance) element including a tunnel joint film.

The correlation between the reference numerals and the components in the embodiment are as below.

HTS . . . heat shield layer, MS . . . magnetic spacing, 1 . . . chassis, 2 . . . magnetic disk, 3 . . . head arm assembly (HAA), 4 . . . head gimbals assembly (HGA), 4A . . . slider, 4B . . . suspension, 5 . . . arm, 6 . . . drive section, 7 . . . fixed axis, 8 . . . bearing, 9 . . . spindle motor, 10 . . . thin film magnetic head, 11 . . . substrate 11A . . . element forming surface, 11S . . . recording medium opposing surface (ABS), 12 . . . insulation layer, 13 . . . lower shield layer, 14 . . . lower gap layer, 15 . . . MR element, 16 . . . magnetic-domain control layer, 17 . . . conductive lead layer, 18 . . . upper gap layer, 19 . . . upper shield layer, 20A . . . read head section, 20B . . . write head section, 22 . . . lower magnetic pole, 23 . . . recording gap layer, 24 . . . coil, 24A and 24B, . . . coil leads, 25 . . . insulation layer, 26 . . . upper magnetic pole, 27 . . . protection film, 28A to 28H . . . insulation layers, 31 and 32 . . . heaters, 41 and 42 . . . resistance sensors.

What is claimed is:

1. A thin film magnetic head having, on a substrate, a magnetic read head section and a magnetic write head section that is stacked on the magnetic read head section in a stacking direction, the magnetic read head section and the magnetic write head section each having its respective end surfaces exposed to an air bearing surface, the magnetic read head section comprising:
a magnetic read element including an end surface exposed to the air bearing surface,
a first heat generation mechanism disposed on an opposite side of the magnetic read element from the air bearing surface and configured to provide heating to the magnetic read head section, and
a first temperature detection mechanism configured to detect the heating provided by the first heat generation mechanism to the magnetic read head section, the first temperature detection mechanism being disposed closer than the first heat generation mechanism to the air bearing surface, the first temperature detection mechanism detecting a first temperature, and an input to the first heat generation mechanism being controlled based on the first temperature, and the magnetic write head section comprising:
- a magnetic pole having an end surface exposed to the air bearing surface,
- a second heat generation mechanism configured to provide heating to the magnetic write head section, the first heat generation mechanism and the second heat generation mechanism being spatially separate in the stacking direction, and
- a second temperature detection mechanism configured to detect the heating provided by the second heat generation mechanism to the magnetic write head section, the second temperature detection mechanism being disposed closer than the second heat generation mechanism to the air bearing surface, the first temperature detection mechanism and the second temperature detection mechanism being spatially separate in the stacking direction, the second temperature detection mechanism detecting a second temperature, and an input to the second heat generation mechanism being controlled based on the second temperature.

2. The thin film magnetic head according to claim 1, wherein the magnetic read head section, a heat shield layer, and the magnetic write head section are layered, in order, on the substrate.

3. The thin film magnetic head according to claim 2, wherein
the first heat generation mechanism, the magnetic read element, the first temperature detection mechanism, the heat shield layer, the second heat generation mechanism, and the second temperature detection mechanism are disposed, in order, from a side of the substrate.

4. The thin film magnetic head according to claim 3, wherein
the second heat generation mechanism and the second temperature detection mechanism are both disposed between the magnetic pole and the heat shield layer.

5. The thin film magnetic head according to claim 1, wherein
the magnetic read head section is provided with a lower magnetic shield layer in a layer between the magnetic read element and the first heat generation mechanism, and an upper magnetic shield layer in a layer between the magnetic read element and the first temperature detection mechanism.

6. The thin film magnetic head according to claim 5, wherein
the first heat generation mechanism is provided in a region which overlaps neither the lower magnetic shield layer nor the upper magnetic shield layer in a lamination direction.

7. The thin film magnetic head according to claim 1, wherein
each of the first and second temperature detection mechanisms has an end surface exposed to the air bearing surface or an end surface located behind the air bearing surface.

8. The thin film magnetic head according to claim 1, wherein
the first temperature detection mechanism is disposed closer than the first heat generation mechanism to the magnetic read element.

9. The thin film magnetic head according to claim 1, wherein
the second temperature detection mechanism is disposed closer than the second heat generation mechanism to the magnetic pole.

10. The thin film magnetic head according to claim 1, wherein
each of the first and second heat generation mechanisms is provided with a heat generating element including one or more materials selected from the group consisting of a nickel-chromiumom alloy (NiCr), copper (Cu), gold (Au), nickel (Ni), cobalt (Co), tantalum (Ta), tungsten (W), molybdenum (Mo), and rhodium (Rh).

11. The thin film magnetic head according to claim 1, wherein
each of the first and second temperature detection mechanisms is configured of a resistance sensor having an electrical resistance which is variable in accordance with a temperature change.

12. A head gimbals assembly, comprising:
a magnetic head slider provided with, on one side surface, the thin film magnetic head of claim 1; and
a suspension, to one end of which the magnetic head slider is attached.

13. A head arm assembly, comprising:
a magnetic head slider provided with, on one side surface, the thin film magnetic head of claim 1;
a suspension, to one end of which the magnetic head slider is attached; and
an arm supporting an other end of the suspension.

14. A magnetic disk device provided with a magnetic recording medium and a head arm assembly, wherein
the head arm assembly includes
a magnetic head slider provided with, on one side surface, the thin film magnetic head of claim 1;
a suspension, to one end of which the magnetic head slider is attached; and
an arm supporting an other end of the suspension.

* * * * *